(12) United States Patent
Shigetomi et al.

(10) Patent No.: US 8,378,272 B2
(45) Date of Patent: Feb. 19, 2013

(54) HEAT TREATMENT APPARATUS, HEAT TREATMENT METHOD AND STORAGE MEDIUM

(75) Inventors: Kenichi Shigetomi, Kumamoto (JP);
Tsutomu Fukunaga, Kumamoto (JP);
Yasuhiro Uchida, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 214 days.

(21) Appl. No.: 13/032,677

(22) Filed: Feb. 23, 2011

(65) Prior Publication Data

US 2011/0210116 A1 Sep. 1, 2011

(30) Foreign Application Priority Data

Mar. 1, 2010 (JP) ................................. 2010-044623

(51) Int. Cl.
*H05B 1/02* (2006.01)
(52) U.S. Cl. ........ 219/494; 219/483; 219/486; 219/497; 118/725; 156/345.52; 438/470; 438/663
(58) Field of Classification Search ............. 219/121.43, 219/494, 497, 505, 483–486; 392/416–418; 118/724, 725, 723 R; 438/470, 663; 156/345.27, 156/347.52
See application file for complete search history.

(56) References Cited

U.S. PATENT DOCUMENTS

| | | | | |
|---|---|---|---|---|
| 5,280,434 A | * | 1/1994 | Ekendahl et al. | 700/296 |
| 5,340,964 A | * | 8/1994 | Galloway et al. | 219/486 |
| 5,900,179 A | * | 5/1999 | Bilenko et al. | 219/508 |
| 6,040,560 A | * | 3/2000 | Fleischhauer et al. | 219/494 |
| 6,072,163 A | * | 6/2000 | Armstrong et al. | 219/497 |

FOREIGN PATENT DOCUMENTS

| | | |
|---|---|---|
| JP | 08-060729 A | 3/1996 |
| JP | 2007-53191 A | 3/2007 |

OTHER PUBLICATIONS

An Office Action dated Jan. 12, 2012, issued from the Japanese Patent Office (JPO) of Japanese Patent Application No. 2010-044623 and a partial English translation thereof.

* cited by examiner

*Primary Examiner* — Mark Paschall
(74) *Attorney, Agent, or Firm* — Abelman, Frayne & Schwab

(57) ABSTRACT

Disclosed is a heat treatment apparatus for performing a heat treatment on an object to-be-processed by a heater, which can inhibit variation in thermal histories among the objects to-be-processed. The heat treatment apparatus includes, among others, a correction part to correct a power control signal output from an adjusting unit so that a conduction rate of an AC voltage applied to a heater is decreased. Specifically, the correction is performed based on a value obtained by multiplying a first correction value with a second correction value, where the first correction value is generated according to a ratio of the voltage detection value of AC power source to a predetermined reference voltage, and the second correction value is generated according to a ratio of the resistance value of the heater to a predetermined reference resistance value.

5 Claims, 10 Drawing Sheets

HEAT TREATMENT APPARATUS, HEAT TREATMENT METHOD AND STORAGE MEDIUM

This application is based on and claims priority from Japanese Patent Application No 2010-044623, filed on Mar. 1, 2010, with the Japanese Patent Office, the disclosure of which is incorporated herein in its entirety by reference.

TECHNICAL FIELD

The disclosure relates to a heat treatment apparatus for performing a heat treatment on an object to-be-processed by a heater, a heat treatment method, and a non-transitory computer readable storage medium.

BACKGROUND

In a photoresist process as one of semiconductor fabrication processes, a resist is coated on the surface of a semiconductor wafer (hereinafter, referred to as a wafer), and then, the resist is exposed with a predetermined pattern and developed so as to form a resist pattern. Such a treatment is generally performed by using a system including a coating/developing apparatus connected to an exposure device, the coating/developing apparatus being configured to perform the coating and development process for the resist.

In the coating/developing apparatus, a heat treatment module is provided which is for heating a wafer before/after coating or development of a resist. The heat treatment module has a heat plate (e.g., a hot plate) on which one wafer is individually disposed and heated. The heat plate includes a seating plate, and a heater such as a heating resistor for heating the seating plate.

In order to improve a throughput, a plurality of heat treatment modules is provided for performing a predetermined process in a photoresist process in the coating/developing apparatus. Then, wafers are simultaneously undergone the heat treatment process in each of the heat treatment modules. A temperature adjuster for supplying power to the heat plate and adjusting the temperature has parameters fixed as, for example, general use conditions. Accordingly, even if a plurality of heat treatment modules is provided for performing a predetermined process as described above, the same parameters may be used among the respective heat treatment modules.

However, the resistance value of the heater may be varied due to the environmental changes during the fabrication of the heat plate. As a result, a rated power (e.g., Wattage) may be varied. In a heat treatment module, a heat plate having, for example, a heater output power ranging from 1300 W to 1800 W at an input voltage to of 200V as a specification may be embedded. Also, in a case of an AC power source for supplying power to the heater, an input voltage applied to the heater may be varied. For example, when the input voltage is set as 200V as a specification, an actual input voltage may be varied within a range of 170V to 242V. Due to the variation of the rated wattage of the heater, and the variation of the input voltage of the heater, as described above, wafers which are subjected to heating processes may have a different thermal history therebetween, and also critical dimensions of resist patterns formed in the wafers may be varied.

Also, an electric device for supplying power to each heat plate, which includes a cable, a breaker, or the like, has to be configured in such a manner that the electric device can withstand the load at a maximum voltage and a heater's maximum rated wattage within the range of operation-assured voltage of the AC power source. Specifically, for example, as described above, when the rated wattage ranges from 1300 W to 1800 W, and an input voltage specification ranges from 170V to 242V, the load is assumed based on a heat plate's maximum rated wattage of 1800 W, and a maximum input voltage of 242V. Herein, since the current is calculated as 242V÷((200V)2÷1800 W)=10.9 A, an electric device capable of flowing such a high current has to be selected. For this reason, the electric device becomes larger, thereby increasing fabrication cost.

Japanese Laid-Open Patent Publication No. 2007-53191 discloses a technology for controlling a thermal history of a substrate by controlling the power of a heat plate of a heat treatment module. However, in the technology, a method for controlling a current value to withstand the variation of AC voltage, and the variation of a heater's resistance value is not described. Thus, it is not possible to solve the above described problems.

SUMMARY

According to one embodiment, there is provided a heat treatment apparatus The heat treatment apparatus includes: a temperature detecting part to detect temperature of an object to-be-processed to which a heat treatment is performed by a heater; an adjusting unit to output a power control signal based on a difference between a temperature setting value of the object to-be-processed and a temperature detection value of the temperature detecting part; an AC power supply part to supply power to the heater; a control unit to control a conduction rate of an AC voltage output from the AC power supply part based on the power control signal; a voltage detecting part to detect the AC voltage; and a correction part to correct the power control signal output from the adjusting unit so that the conduction rate is decreased when a voltage detection value is increased or resistance of the heater is decreased. Specifically, the correction part corrects the power control signal output using a value obtained by multiplying a first correction value with a second correction value, the first correction value is generated according to a ratio of the voltage detection value detected by the voltage detecting part to a predetermined reference voltage, and the second correction value is generated according to a ratio of the resistance value of the heater to a predetermined reference resistance value.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
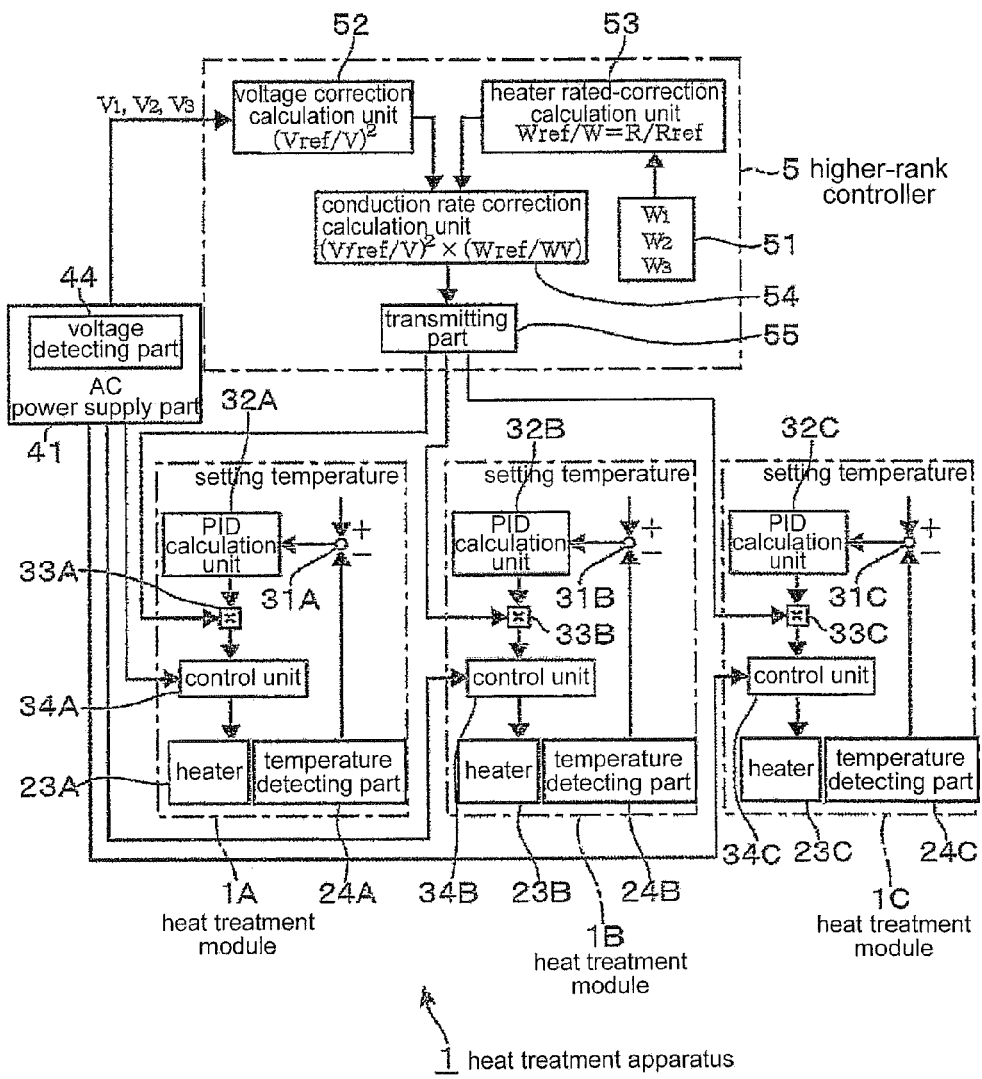
FIG. 1 is a block diagram illustrating the configuration of a heat treatment apparatus of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure has been made in consideration of these problems, and provides a technology for performing a heat treatment on an object to-be-processed by a heater, which can inhibit the variation in thermal histories among objects to-be-processed, and prevent a device from being large-sized.

According to one embodiment, there is provided a heat treatment apparatus to perform a heat treatment on a substrate by a heater, the heat treatment apparatus including: three heat plates each configured to dispose the substrate and provided with the heater; a temperature detecting part provided in each of the three heat plates to detect a temperature of the substrate disposed on each of the three heat plates; an adjusting unit to output a power control signal to each of the three heat plates based on a difference between a temperature setting value of the substrate and a temperature detection value of the temperature detecting part in each of the three heat plates; an AC power supply part to supply power to the heater provided in each of the three heat plates; a distribution part provided in the AC power supply part and configured to distribute each phase of three-phase AC of the AC power supply part to the heater of each of the three heat plates; a control unit to control a conduction rate of an AC voltage distributed from the distribution part of the AC power supply part and output to the heater of each of the three heat plates based on the power control signal in each of the three heat plates; a voltage detecting part to sequentially detect the AC voltage of each phase of three-phase AC; and a correction part to correct the power control signal output from the adjusting unit so that the conduction rate is decreased when a voltage detection value is increased or resistance of the heater is decreased. In particular, the correction part corrects the power control signal output using a value obtained by multiplying a first correction value with a second correction value, the first correction value being generated according to a ratio of the voltage detection value of one of the phases of the three-phase AC detected by the voltage detecting part to a predetermined reference voltage, and the second correction value being generated according to a ratio of the resistance value of the heater of each of the three heat plates to which the AC voltage of a detected phase is distributed to a predetermined reference resistance value. Further, the correction part corrects the power control signal output to each of the three heat plates, the reference voltage is the smallest value among a voltage variation of the AC voltage, the reference resistance is the largest value among a resistance variation of the heater, and the conduction rate becomes a maximum when the voltage detection value is the reference voltage and the resistance value is the reference resistance value.

For example, the value obtained by multiplying the first correction value with the second correction value is output to the correction part from an upper level controller common to the three heat plates.

According to another embodiment of the present disclosure, there is provided a heat treatment method to perform a heat treatment on a substrate by a heater, the heat treatment method including: providing three heat plates each configured to dispose the substrate and provided with the heater; detecting a temperature of the substrate disposed on each of the three heat plates by a temperature detecting part provided in each of the three heat plates; outputting a power control signal to each of the three heat plates by an adjusting unit based on a difference between a temperature setting value of the substrate and a temperature detection value detected by the temperature detecting part; distributing and supplying each phase of three-phase AC of an AC power supply part to the heater of each of the three heat plates by a distribution part provided in the AC power supply part common to each of the three heat plates; controlling a conduction rate of an AC voltage distributed from the distribution part of the AC power supply part and output to the heater in each of the three heat plates by a control unit based on the power control signal; sequentially detecting the AC voltage of each phase of three-phase AC which is a first side of the distribution part by a voltage detecting part; and correcting the power control signal output from the adjusting unit by a correction part so as to the conduction rate is decreased when a voltage detection value is increased or resistance of the heater is decreased. In particular, the correction part corrects the power control signal output using a value obtained by multiplying a first correction value with a second correction value, the first correction value being generated according to a ratio of the voltage detection value of one of the phases of the three-phase AC detected by the voltage detecting part to a predetermined reference voltage, and the second correction value being generated according to a ratio of the resistance value of the heater of each of the three heat plates to which the AC voltage of a detected phase is distributed to a predetermined reference resistance value. The correcting process of the power control signal is performed with respect to the power control signal output to each of the three heat plates, the reference voltage is the smallest value among a voltage variation of the AC voltage, the reference resistance is the largest value among a resistance variation of the heater, and the conduction rate becomes a maximum when the voltage detection value is the reference voltage and the resistance value is the reference resistance value.

For example, the heat treatment method further comprising outputting multiplied value to the correction part from an upper level controller common to the three heat plates.

In accordance with a further embodiment of the present disclosure, there is provided a non-transitory computer readable storage medium to store a program used in an apparatus to perform a heat treatment on a substrate disposed on a heat plate by a heater provided in the heat plate, wherein in the program, a group of steps to execute the above described heat treatment method is programmed.

In the heat treatment apparatus of the present disclosure, the correction is carried out in such a manner that a conduction rate of an AC voltage for a heater can be decreased based on a value obtained by multiplying a first correction value with a second correction value, the first correction value being generated according to a ratio of the voltage detection value of an AC power source to a predetermined reference voltage, and the second correction value being generated according to a ratio of the resistance value of the heater to a predetermined reference resistance value. Accordingly, even when the voltage value of an AC power source is high, and the resistance value of a heater is low, it is possible to inhibit the increase of a current value flowing in the heater. As a result, it is possible to inhibit the variation in thermal histories among the objects to-be-processed, and prevent a device from being large-sized.

Hereinafter, a heat treatment apparatus of the present disclosure will be described. FIG. 1 is a view illustrating the entire configuration of a heat treatment apparatus 1. Heat treatment apparatus 1 includes, for example, three heat treatment modules 1A, 1B, and 1C, and the operation of the heat treatment modules 1A, 1B, and 1C is controlled by a common higher-rank controller 5. These heat treatment modules 1A, 1B, and 1C are, for example, mounted in a coating/developing apparatus so as to be used for performing the same process on a wafer H such as a heating process followed by the coating of resist.

Figure 2:
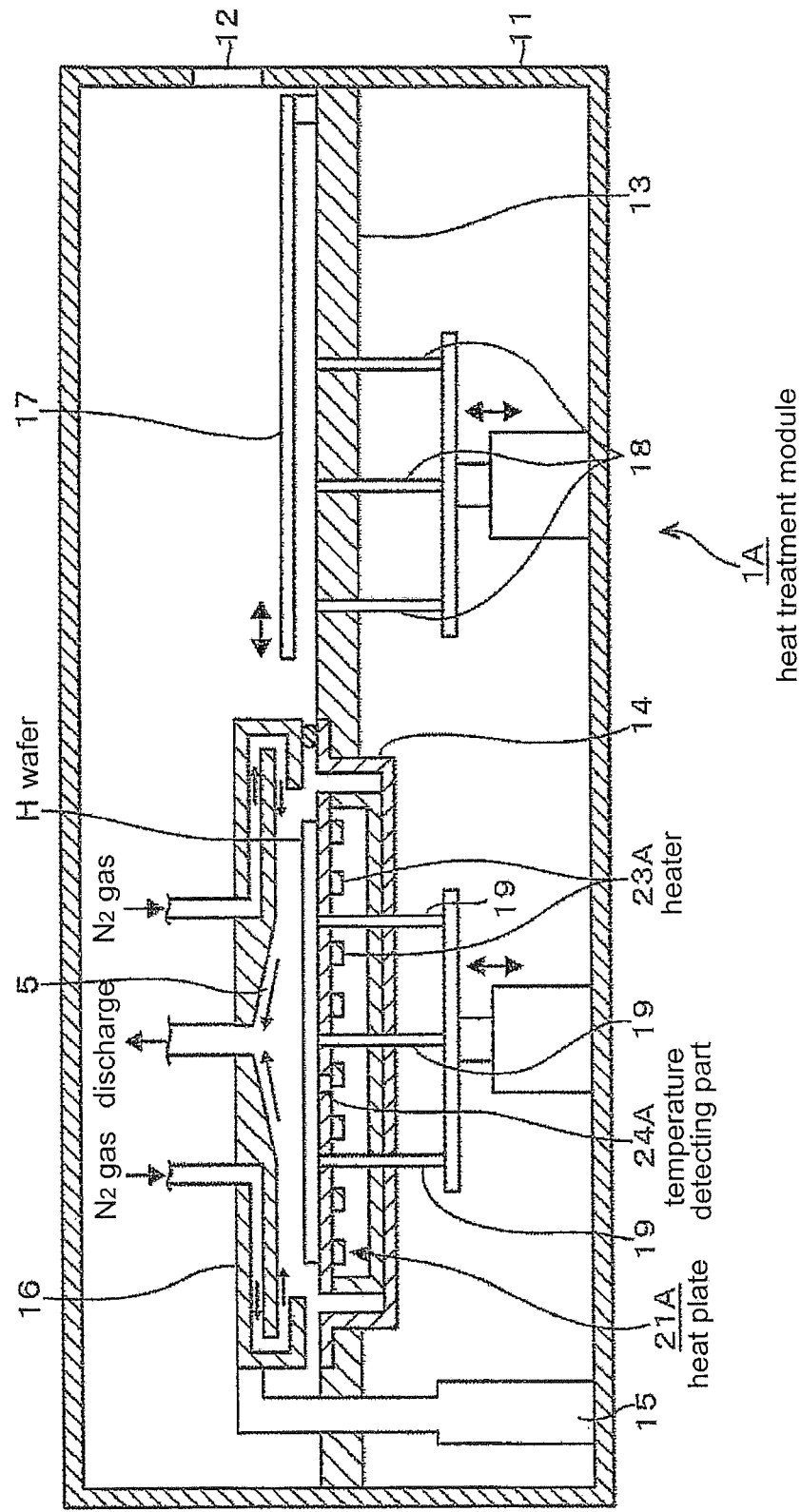
FIG. 2 is a vertical-sectional view illustrating a heat treatment module constituting the heat treatment apparatus.

Hereinafter, the configuration of heat treatment module 1A will be described with reference to FIG. 2. FIG. 2 shows a vertical-sectional view of heat treatment module 1A. Heat treatment module 1A includes a housing 11. At the sidewall of housing 11, a carrying hole 12 of wafer H to be used as an object to-be-processed is formed. Within housing 11, taking carrying hole 12's side as the front side, a heat plate (hot plate) 21A is provided at the inner side. Heat plate 21A includes a seating plate 22 on which wafer H is disposed, and a heater 23A formed at the rear surface of seating plate 22. Also, a temperature detecting part 24A is provided in seating plate 22 for detecting the temperature of wafer H is provided.

Figure 3:
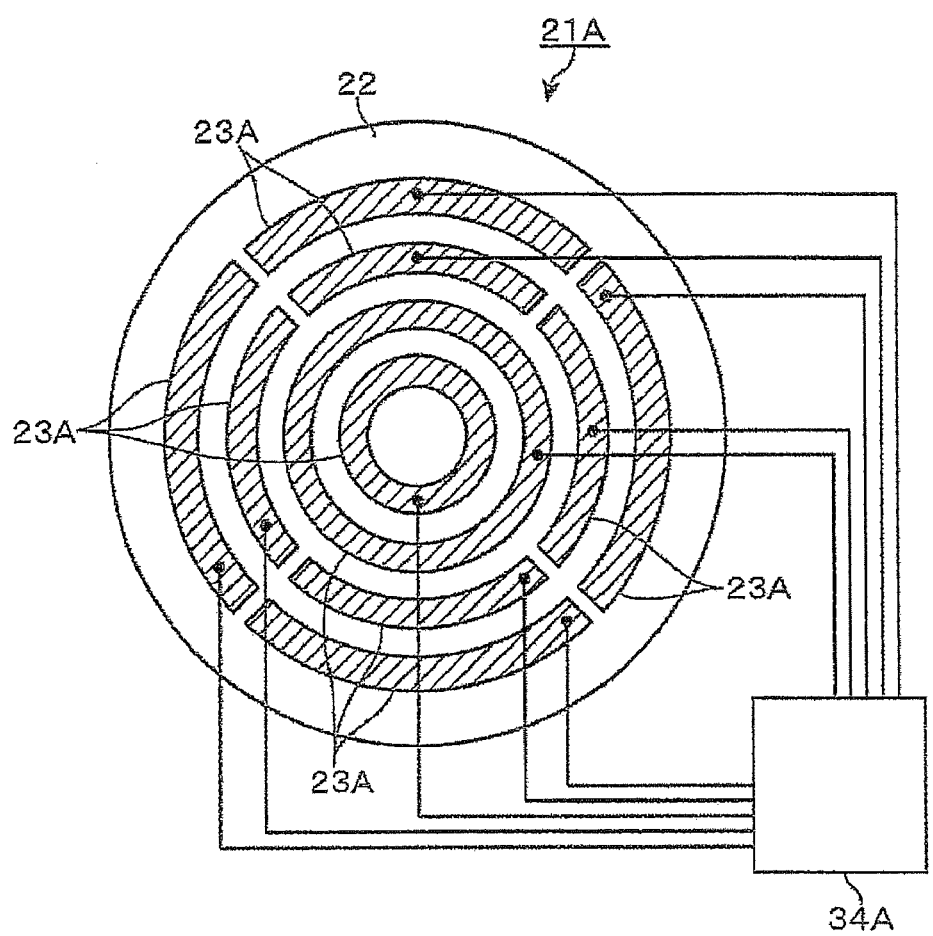
FIG. 3 is a plan view illustrating a heat plate provided in the heat treatment module.

FIG. 3 shows the rear surface of heat plate 21A. Heater 23A is a heating resistor, and is formed by screen-printing of a thin line-shaped metallic body. However, for convenience of illustration, heater 23A is illustrated as a plate-shaped body formed with oblique lines. As shown in the drawing, a plurality of heaters 23A is disposed in a concentric circle shape with respect to the center of heat plate 21A. Also, heaters at the circumferential periphery are separated along the circumferential direction. To each of heaters 23A, power can be independently supplied. Also, in the present embodiment, the control of power supply is independently performed for each of heaters 23A.

As shown in FIG. 2, heat plate 21A is supported by a base 13 provided within housing 11 through a supporting part 14. A cover 16 which is elevatable by an elevating mechanism 15 is provided above heat plate 21A. When cover 16 is lowered, an airtight treatment space S is formed around wafer H disposed on heat plate 21A. Then, cover 16 supplies $N_2$ gas from the circumferential periphery's side of wafer H, and discharges gas at the center side. This forms an air stream from the circumferential periphery's side of wafer H toward the center side, as shown by arrows in the drawing. By being exposed to the air stream, wafer H is subjected to a heating process. While wafer H is not subjected to a heating process, cover 16 is raised, thereby allowing wafer H to be disposed on heat plate 21A.

At the front side within housing 11, a cooling plate 17 is provided for cooling wafer H heated by heat plate 21A. Cooling plate 17 carries wafer H between carrying hole 12's side and the above position of heat plate 21A, and cools wafer H heated by heat plate 21A. An elevating pin 18 is elevatably configured, and transfers wafer H between a carrying means at the outside of heat treatment apparatus 1, and cooling plate 17. An elevating pin 19 transfers wafer H between cooling plate 17 moved to a position above heat plate 21A and heat plate 21A. In the thickness direction of cooling plate 17, slits (not shown) are formed allowing respective elevating pins 18 and 19 to protrude from the upper portion of cooling plate 17 so that the above mentioned respective transfers can be performed.

As shown in FIG. 1, temperature detecting part 24A of heat plate 21A is connected to a temperature comparing part 31A. Also, although not shown to avoid complexity, for example, temperature comparing part 31A is connected to higher-rank controller 5 as described below. A user can set temperatures of wafers H heated by respective heat treatment modules through an input part (not shown) provided in higher-rank controller 5. Each of the setting temperatures is output to a temperature comparing part 31. Then, temperature comparing part 31A compares the setting temperature to wafer H's temperature detected by temperature detecting part 24A, and outputs a difference therebetween to a PID calculation unit 32A. PID calculation unit 32A performs a PID calculation of the difference between the setting temperature and the detected temperature, and outputs the calculated value.

Also, heat treatment module 1A includes a control unit 34A. Control unit 34A performs a zero cross control on an AC voltage supplied to heater 23A from an AC power supply part 41, based on the calculated value (specifically, based on a corrected calculation value obtained by correcting the calculated value, as described below). Then, it controls, for example, the conduction time of a solid state relay (SSR) within a predetermined time interval, and determines the number of times when half waves between zero crossings are 'ON' in an AC waveform in the time interval, thereby controlling the conduction rate of an AC voltage. Accordingly, the calculation value calculated by PID calculation unit 32A is converted into a control signal according to a zero cross method used in control unit 34A, by a converting part (not shown). For example, in a case where the control signal is a pulse with a duty ratio determining a conduction rate, a circuit for generating the pulse is included. Meanwhile, in a case where the control signal is a current signal having a current value determining a conduction rate, a circuit for outputting a current signal of a current value according to the calculated value is included.

Figure 4:
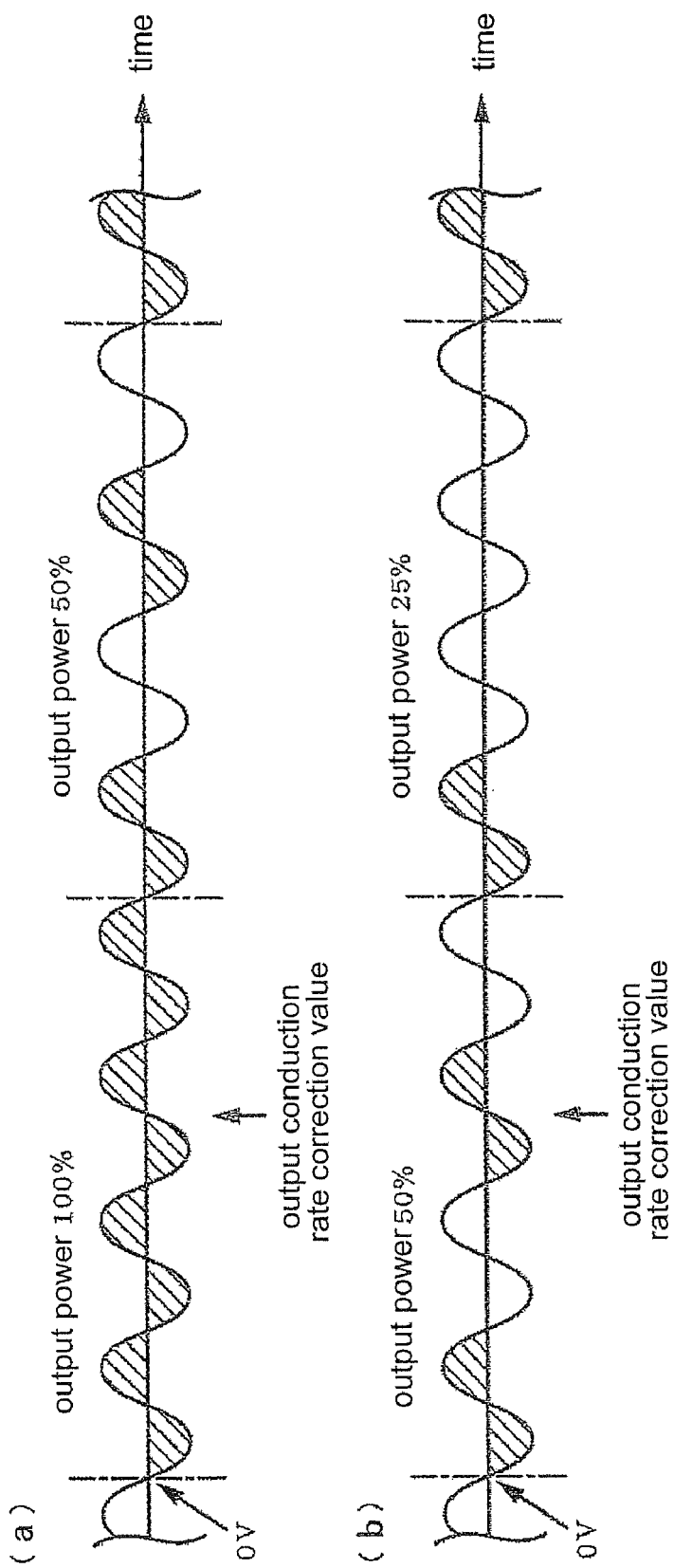
FIG. 4 is a schematic view illustrating a wave form of a voltage applied to a heater.

Between PID calculation unit 32A and control unit 34A, a multiplying part 33A is provided. Multiplying part 33A multiplies a conduction rate correction value received from higher-rank controller 5, with the calculation value (voltage signal) output from PID calculation unit 32A, so as to correct the calculation value. Control unit 34A, which has controlled a conduction rate in a predetermined time interval, controls a conduction rate in a next time interval, based on the corrected calculation value when the corrected calculation value is calculated as described above. FIGS. 4a and 4b schematically show examples of a waveform of an AC voltage applied to heater 23A. As shown in the figures, the parts indicated by dotted lines in the waveform illustrate a waveform of the voltage when the voltage is not applied to heater 23 because control unit 34A turns off the voltage. In the graphs, an interval between chain-dotted lines indicates the above described predetermined time interval. By the number of 'ON's of half waves in the interval, the output power of heater 23A is determined. In the example shown in FIG. 4a, the output power of heater 23A changes from 100% to 50%, and the output power of heater 23A changes from 50% to 25% in the example shown in FIG. 4b. In half waves with 'ON's, slant lines are drawn. Unlike a case where only one of a half wave greater than 0V and a half wave smaller than 0 V is set as 'ON', in the example as shown in FIG. 4, upper and lower voltage outputs may be set to be the same by setting both half waves greater and smaller than 0V to be as 'ON'. This inhibits deterioration of a heater, and allows a right value to be detected during current measurement.

Heat treatment modules 1B and 1C are configured in the same manner as that of heat treatment module 1A. In heat treatment modules 1B and 1C, respective components corresponding to those designated with A in the description on heat treatment module 1A, are designated with B and C, respectively, instead of A. Then, each of heat treatment modules 1A, 1B, and 1C independently performs a temperature rise control of heater 23 of a heat plate.

Figure 5:
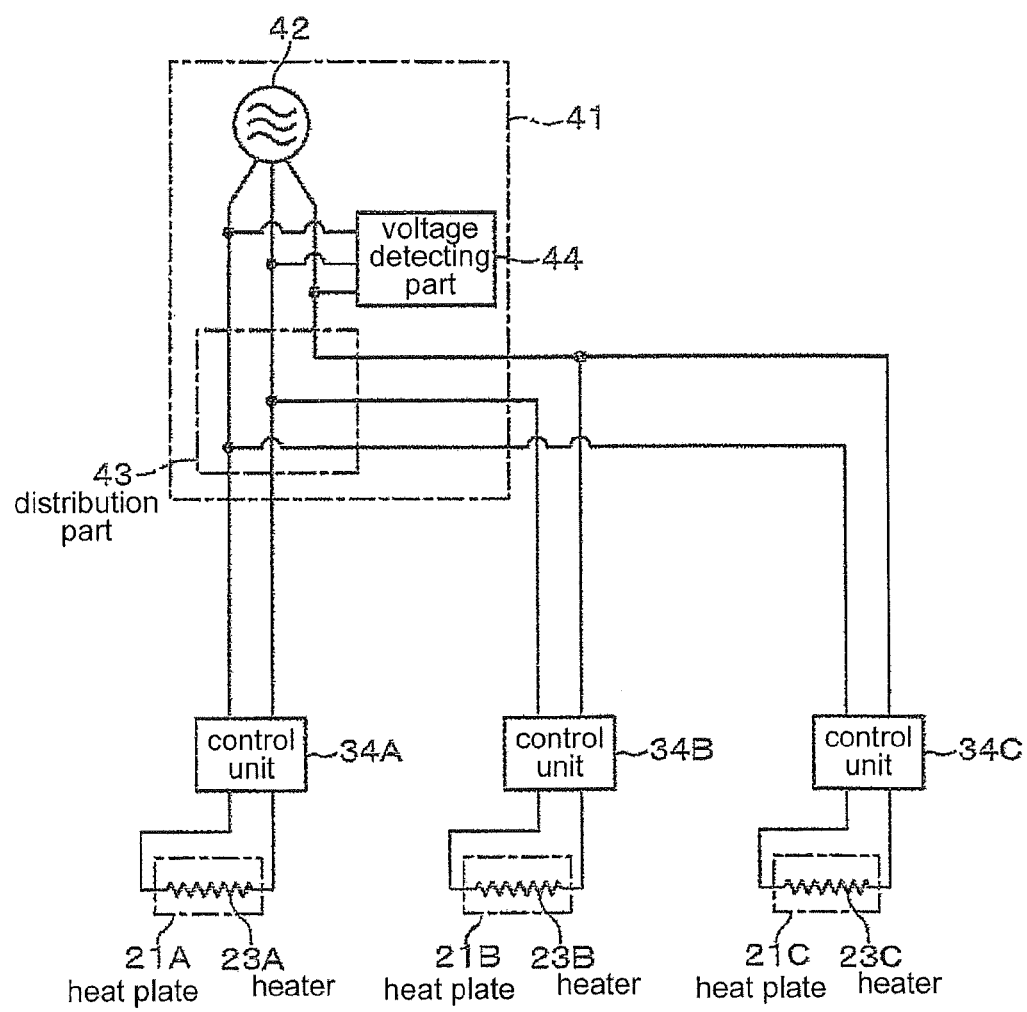
FIG. 5 is a configuration view illustrating an AC power supply part.

Subsequently, AC power supply part 41 will be described with reference to FIG. 5. AC power supply part 41 includes, for example, a 3-phase AC power source 42, and 3-phase AC power source 42 is connected in such a manner that U-, V-, and W-phases of 3-phase AC power are distributed to heaters 23A, 23B, and 23C, respectively. Also, a connection portion of a conductive cable in the part indicated by a chain-dotted line in FIG. 5 includes a distribution part 43 for distributing these respective phases to respective heaters. In the primary of distribution part 43, a voltage detecting part 44 is provided which detects each of U-, V-, and W-phase voltages, and transmits a detection signal of each phase to higher-rank controller 5. In the description below, detected voltages input to heaters 23A, 23B, and 23C are referred to as V1, V2, and V3.

Subsequently, hereinafter, the configuration of higher-rank controller 5 will be described. Higher-rank controller 5 includes a memory 51, a voltage correction calculation unit 52, and a heater rated-correction calculation unit 53. At the below side of voltage correction calculation unit 52 and heater rated-correction calculation unit 53, a conduction rate correction calculation unit 54 is provided. When a user inputs previously measured rated power values W1, W2, and W3 of respective heaters 23A, 23B, and 23C through an input part (not shown), these respective values are recorded in memory 51.

Voltage correction calculation unit 52 is connected to voltage detecting part 44, and voltage detecting part 44 outputs detection signals corresponding to detected input voltages V1, V2, and V3, to voltage correction calculation unit 52. Voltage correction calculation unit 52 calculates a voltage correction amount of each of heaters 23A, 23B, and 23C, $Vref^2/V^2$ (wherein, V indicates V1, V2 or V3). Vref indicates a reference voltage, and this value is the lowest value in a voltage specification range of a device. Also, voltage correction calculation unit 52 outputs each voltage correction value to conduction rate correction calculation unit 54, in which $Vref^2/V1^2$ is set as a voltage correction value of heater 23A, $Vref^2/V2^2$ is set as a voltage correction value of heater 23B, and $Vref^2/V3^2$ is set as a voltage correction value of heater 23C.

Heater rated-correction calculation unit 53 calculates a ratio of a rated power value of each of heaters 23A to 23C to a predetermined reference rated power value Wref. A rated power value of a heater indicates a power value when a predetermined voltage, for example, a voltage of 200V, is applied. This rated power value, as described in the 'BACK-GROUND', may change, for example, from 1300 W to 1800 W. When rated power values of heaters 23A, 23B, and 23C are W1, W2, and W3, respectively, reference rated power value Wref is the lowest one of W1, W2, and W3. Heater rated-correction calculation unit 53 calculates heater rated-correction values of heaters 23A, 23B, and 23C, that is, Wref/W (W indicates W1, W2 or W3). Also, it outputs the calculated rated-correction values to conduction rate correction calculation unit 54, in which Wref/W1 is a rated correction value of heater 23A, Wref/W2 is a rated correction value of heater 23B, and Wref/W3 is a rated correction value of heater 23C.

As described above, through the determination of values of reference voltage Vref, and reference rated power Wref, a value resulting from PID correction is maximum (a calculated value itself) when a detected voltage value is the reference voltage, and a rated power value is the reference rated power value. Thus, the current value flowing in each of heaters 23A to 23C is determined when a voltage and a rated power value are minimized.

Herein, the variation of a rated power value is caused by the variation of a resistance value. Accordingly, in a case where resistance values of heaters 23A, 23B, and 23C are set as R1, R2, and R3, respectively, the heater rated-correction value Wref/W is represented as R/Rref (R indicates one of R1, R2, and R3) when the highest resistance value among these values is set as a reference resistance value Rref. A heater having Wref is the same as that having Rref. In other words, heater rated-correction calculation unit 53 calculates the ratio of a resistance value of each heater 23 to a predetermined reference resistance value.

Conduction rate correction calculation unit 54 calculates a conduction rate correction value of each heater 23, that is, $Vref^2/V^2 \times Wref/W$, based on the output from voltage correction calculation unit 52 and the output from heater rated-correction calculation unit 53. Various calculations as described above may be performed through hardware configuration, or may be performed by software through the construction of a program. After the above described calculations, a program for controlling the conduction rate of an AC voltage applied to each of heaters 23A to 23C, as described below, is stored and executed in a program storage part (not shown) in a state where it is received in a recording medium such as a hard disk, a compact disk, a magnet optical disk, or a memory card.

Also, a transmitting part 55 of higher-rank controller 5 has a function of outputting the conduction rate correction value calculated by conduction rate correction calculation unit 54 as described above, to multiplying part 33 of a heat treatment module corresponding to the correction value, according to, for example, a timing of time interval for performing zero-cross control. Also, in each heat treatment module, for example, a temperature controller is formed with temperature comparing part 31, PID calculation unit 32, multiplying part 33, and control unit 34. A digital value is output to multiplying part 33 from PID calculation unit 32. The conduction rate correction value is received by the temperature controller by a communication from higher-rank controller 5, and the digital value is input to multiplying part 33.

Subsequently, for a process for controlling the output of heater 23A of heat treatment module 1A, the operation of heat treatment apparatus 1 will be described. In memory 51, each of rated power values W1, W2, and W3 is previously recorded. When a user sets the treatment temperature of wafer H in each heat treatment module through an input part, and, for example, an instruction for starting a treatment in each heat treatment module is made from the input part, wafer H is carried into housing 11 by a carrying means (not shown). Wafer H is transferred in order of elevating pin 18→cooling plate 17→elevating pin 19, and is disposed on heat plate 21A. Then, temperature comparing part 31A calculates the difference between wafer H's setting temperature and wafer H's detected temperature detected by temperature detecting part 24A of heat plate 21A, and outputs the difference to PID calculation unit 32A. Based on the difference, a PID calculation is performed in PID calculation unit 32A, and the calculated value is output to multiplying part 33A as a voltage signal.

Meanwhile, 3-phase AC power source 42 of AC power supply part 41 is set as 'ON', voltage detecting part 44 detects input voltages (V1~V3) of respective phases, and outputs these detected values to higher-rank controller 5. Voltage correction calculation unit 52 calculates $Vref^2/V^2$, and outputs the calculated value to conduction rate correction calculation unit 54. Meanwhile, rated power values (W1~W3) of respective heaters 23A to 23C are read from memory 51, and heater rated-correction calculation unit 53 calculates Wref/W, and outputs the calculated value to conduction rate correction calculation unit 54. Then, in conduction rate correction calculation unit 54, a conduction rate correction value of each heater 23, that is, $Vref^2/V^2 \times Wref/W$, is calculated, and a conduction rate correction value of heater 23A, that is, $Vref^2/V1^2 \times Wref/W1$, is output to multiplying part 33A.

Then, the above described voltage signal output to multiplying part 33A from PID calculation unit 32A is corrected by a multiplying operation at the conduction rate correction value of heater 23A, that is, $Vref^2/V1^2 \times Wref/W1$, and the corrected voltage signal is converted into a control signal corresponding to the voltage signal by a converting part (not shown). The control signal is determined by a zero cross control method, and, for example, a current value according to the voltage of the voltage signal may be obtained. Also, according to the current value, for example, the number of half waves with 'ON' is determined in a predetermined interval at an AC voltage (50 Hz) supplied from AC power supply part 41 to heater 23A. Thus, a conduction rate is determined, and power is supplied to heater 23A according to the conduction rate.

While the power control of heater 23A has been described, $Vref^2/V2^2 \times Wref/W2$ is output to multiplying part 33B as a conduction rate correction value in a case of power control of heater 23B, and $Vref^2/V3^2 \times Wref/W3$ is output to multiplying part 33C as a conduction rate correction value in a case of power control of heater 23C. In heaters 23B and 23C, power control is performed in a similar manner as in heater 23A, except for the difference between correction values.

Herein, as described above, for example, when an AC voltage supplied to heater 23 of a heat treatment module has a lowest value in a voltage variation, and the rated voltage W of heater 23 has a minimum value (i.e., the resistance value of heater 23 is at a maximum value), a conduction rate correction value, that is, $Vref^2/V^2 \times Wref/W$, becomes "1"], and PID calculation value is converted into a control signal as it is without any correction. Herein, when one or more of V and W is greater than the lowest value, the correction value is lower than "1" according to values of V and W. As a result, the conduction rate is lower than that at a minimum rated voltage W, and a minimum voltage V of AC power supply part 41. In other words, even when V and W have higher values, the current value flowing in each of heaters 23A to 23C is set as a current value at the lowest values of V and W. For example, as noted in BACKGROUND, in a case where an AC voltage V varies within a range of 170 to 242V, and the rated power value W ranges from 1300 to 1800 W, the current flowing in heaters 23A to 23C is 170 V±((200 V)$^2$±1300 W)=5.5 A, which is lower than 10.9 A at the expected highest values of V and W.

After wafer H is disposed on heat plate 21A, for example, and a predetermined time is elapsed, wafer H is carried from heat plate 21A in a reverse order to that in the carrying of wafer H.

As described above, in heat treatment apparatus 1, the correction values of correction rates of AC voltages applied to heaters 23A to 23C are calculated and the correction rates are controlled based on voltages (V1~V3) of AC power supply part 41, and rated voltages (W1~W3) of heaters 23A to 23C. Thus, even when the voltage (V) and the rated voltage (W) have high values, the current values flowing in heaters 23A to 23C are set as current values at the lowest values of voltages (V1~V3) and rated voltages (W1~W3). Accordingly, it is possible to inhibit the variation of thermal histories among wafers H. Also, it is possible to decrease the load applied to an electric device, such as a breaker or a cable, required for applying voltage of AC power supply part 41 to heater 23, thereby preventing the electric device from being large-sized. Thus, it is possible to inhibit heat treatment apparatus 1 from being large-sized.

Also, in AC power supply part 41, voltages (V1~V3) of respective phases of 3-phase AC power to heaters 23A to 23C are measured by voltage detecting part 44 at the upper side of distribution part 43 distributing respective phases of 3-phase AC power to heaters 23A to 23C. There is no need to consider the detection precision of parts to be measured, as compared to the case where input voltages of respective heat treatment modules are measured at the lower side of distribution part 43. Thus, it is possible to detect each voltage with high precision, and then to control the thermal history of wafer H with higher precision.

However, although heater rated-correction calculation unit 53 determines heater rated-correction values based on respective rated power values (W1~W3) of heaters 23A to 23C rated power values recorded in memory 51 in the above described example, a heater rated-correction value may be determined based on a temperature rise time of each heat plate 21. The temperature rise time indicates a time required for increasing the temperature of heat plate 21 from a first temperature to a second temperature, which is higher than the first temperature, through heating of heat plate 21 by heater 23. For example, in heat plates in the same lot, when an ambient temperature or a voltage supplied to heater 23 are uniform, the temperature rise time T is in inverse proportion to the rated power value W. Then, this temperature rise time is previously measured, and the temperature rise time of each heat plate 21 in the above embodiment is recorded in memory 51. Then, for the calculation in each heat plate 21, for example, the longest temperature rise time T may be set as a reference temperature rise time Tref, and T/Tref may be set as a heater rated-correction value.

Also, the temperature rise time is not limited to that of heat plate 21. For example, a wafer provided with a temperature sensor is disposed on a heat plate being heated. The temperature sensor is configured to measure the temperature of the wafer, and inspects the time interval during which the temperature of the wafer reaches a setting temperature. The temperature rise time of the wafer corresponds to the temperature rise time of heat plate 21, and thus, the heater rated-correction value may be calculated based on the wafer's temperature rise time obtained as described above.

Also, in some cases, wafer H may have a flexure when being loaded into heat plate 21A. For example, a flexure shape and a flexure extent of wafer H may be measured by a flexure detector before wafer H is loaded into heat plate 21A. As described above, heaters 23A are disposed on heat plate 21A in a separate manner, and each of them is independently heated. Thus, the conduction rate correction value is calculated as described above, and a flexure correction value is calculated according to the flexure shape and the flexure extent. Then, the conduction rate correction value may be further corrected by the flexure correction value, and the conduction rate of the voltage of each of heaters 23A may be independently controlled so as to increase the uniformity of heat quantities of respective parts of wafer H.

Although voltages of respective phases of 3-phase AC power source 42 are allocated to be applied to respective heat treatment modules 1A to 1C in the above described example, the modules may be allocated in such a manner that one phase voltage can be applied to a plurality of heat treatment modules. Accordingly, the number of heat treatment modules allocated to one AC power source is not limited to three (3) units.

Evaluation Test
Evaluation Test 1

Figure 6:
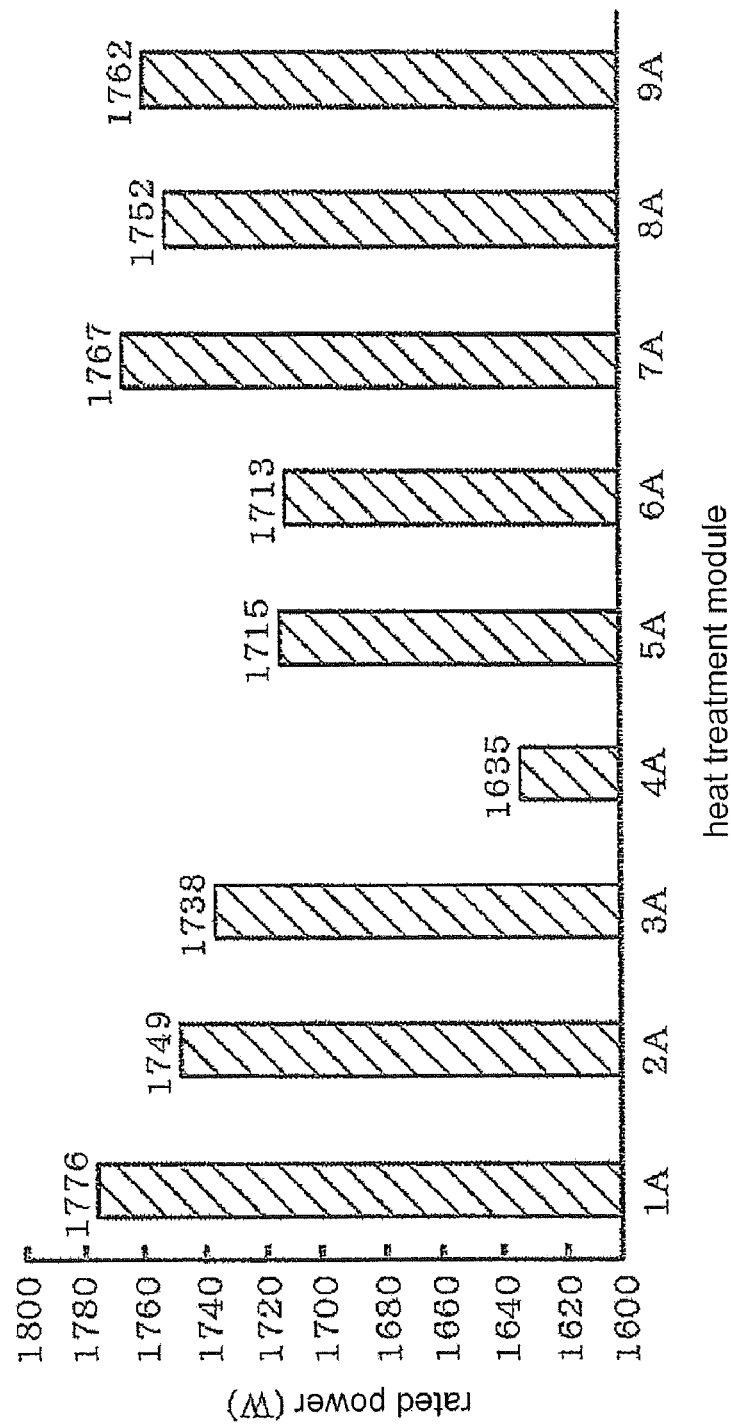
FIG. 6 is a graph showing rated power values of heat treatment modules used in an evaluation test.

Nine (9) heat treatment modules provided with heat plates having different rated power values were prepared. FIG. 6 is a graph showing the rated power values of the heat plates of respective heat treatment modules each numbered as 1A through 9A. In the graph, rated power values of respective modules are shown. Each heat plate was fabricated in such a manner that the rated power value is in the range of 1300 W to 1800 W. However, the rated power value of the heat plate of heat treatment module 4A is significantly lower than those of heat plates of other heat treatment modules. By using the respective heat treatment modules 1A to 9A, respective wafers were subjected to heat treatments in a predetermined treatment step of a fabrication process of a resist pattern. A total of twenty five (25) wafers were divided into groups of 1A to 9A and processed. For the convenience of description, the wafers were designated with numbers of one (1) to twenty five (25). Then, after the respective wafers were formed with resist patterns, average values of critical dimensions CD of the resist patterns were calculated. In the EVALUATION TEST 1, the correction of the conduction rate of a voltage, described in the embodiment, was not performed.

Figure 7:
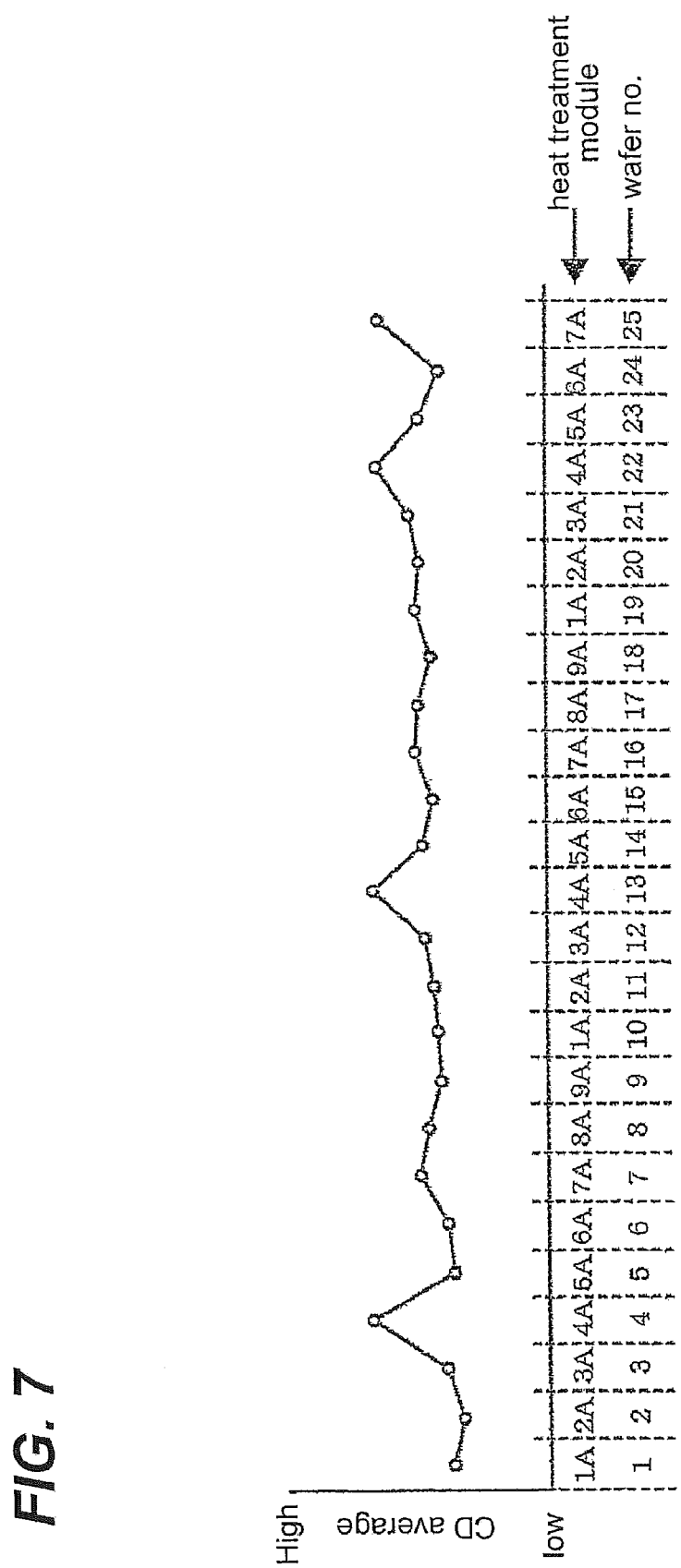
FIG. 7 is a graph showing the variation of line width (CD) averages of wafers treated by respective heat treatment modules.

FIG. 7 is a graph showing the measured CDs of respective wafers 1 to 25, and the numbers of heat treatment modules used for heat treatment of wafers (A). In the graph, as the position of a plot is higher, an average value of CDs of a corresponding wafer is higher. As shown in FIG. 7, in wafers 4, 13, and 22 treated by heat treatment module 4A, CD average values are higher than those of other wafers. From this test, it can be found out that the difference of rated power values of heat plates has an effect on CDs. Accordingly, in order to form patterns with high uniformity on respective wafers, it can be said that it is effective to correct the difference of rated power values among heat plates of heat treatment modules as described in the above embodiment.

Evaluation Test 2

Three (3) heat treatment modules were prepared in the same manner as the above embodiment. Respective wafers were subjected to heat treatments in a predetermined treatment step in a fabrication process of a resist pattern, and then temperatures of wafers being heated were measured. Then, thermal histories of the to wafers were measured. In the treatment, the voltage input to heat plates of three (3) heat treatment modules was set as 200V. Then, CDs were measures for wafers formed with resist patterns. Also, the voltage input to heat plates was changed to 195V and 205V, respectively, and then the same measurement was performed. In this evaluation test, the conduction rate described in the embodiment was not corrected.

Figure 8:
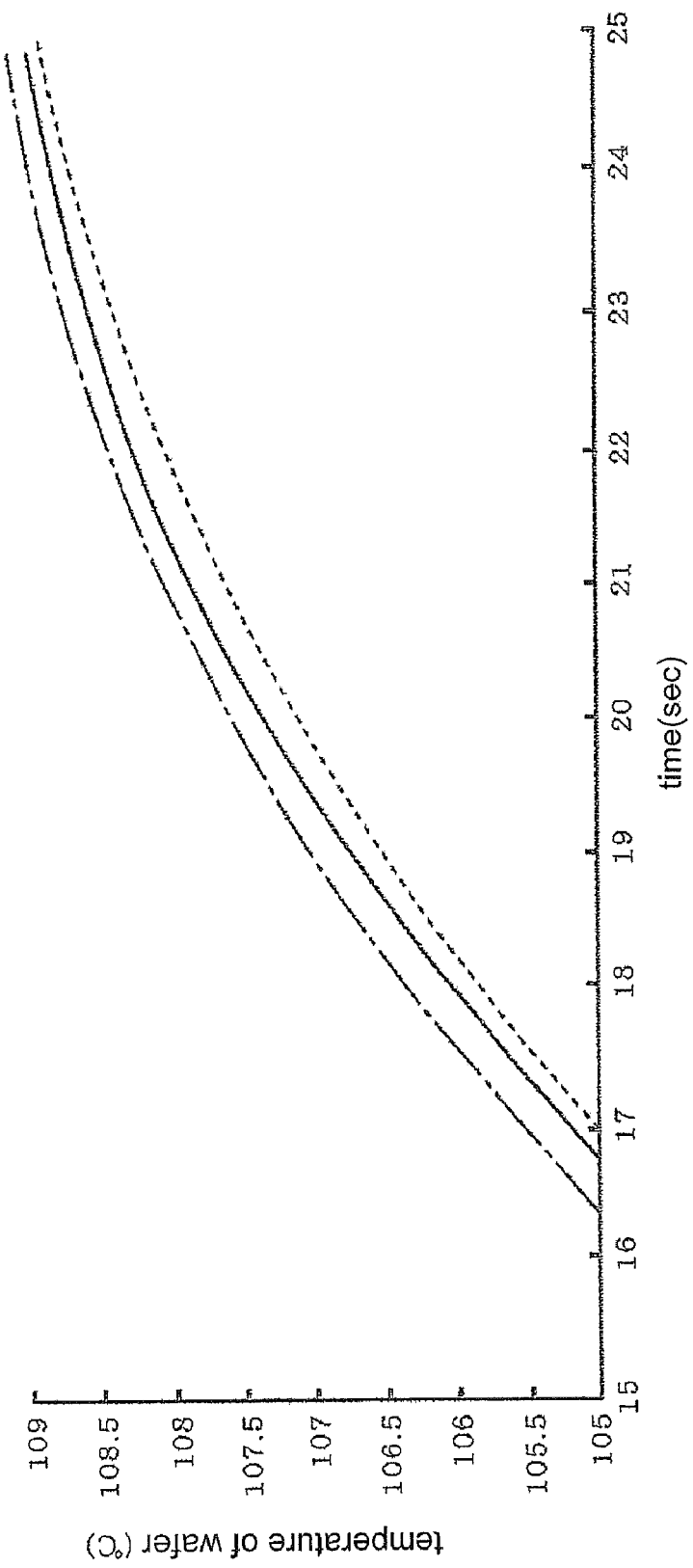
FIG. 8 is a graph showing thermal histories of wafers treated in an evaluation test.

FIG. 8 shows thermal histories of respective wafers obtained from the above test. The y axis of the graph represents the temperature of wafers, and the x axis of the graph represents the time period in second from the start of the temperature rise. In the drawing, each of the solid curve, dotted curve, and chain-dotted curve indicates the thermal history of each wafer at input voltages of 200V, 195V, and 205V, respectively. In this manner, when the input voltage value is low, temperature rise of a wafer is slow, and, on the other hand, when the input voltage value is high, temperature rise of a wafer is quick. Also, although the heat treatments by respective heat treatment modules were performed at voltages of 195V, 200V, and 205V, respectively, modules applied with the same voltage did not show a significant difference in thermal histories of wafers among the modules.

Figure 9:
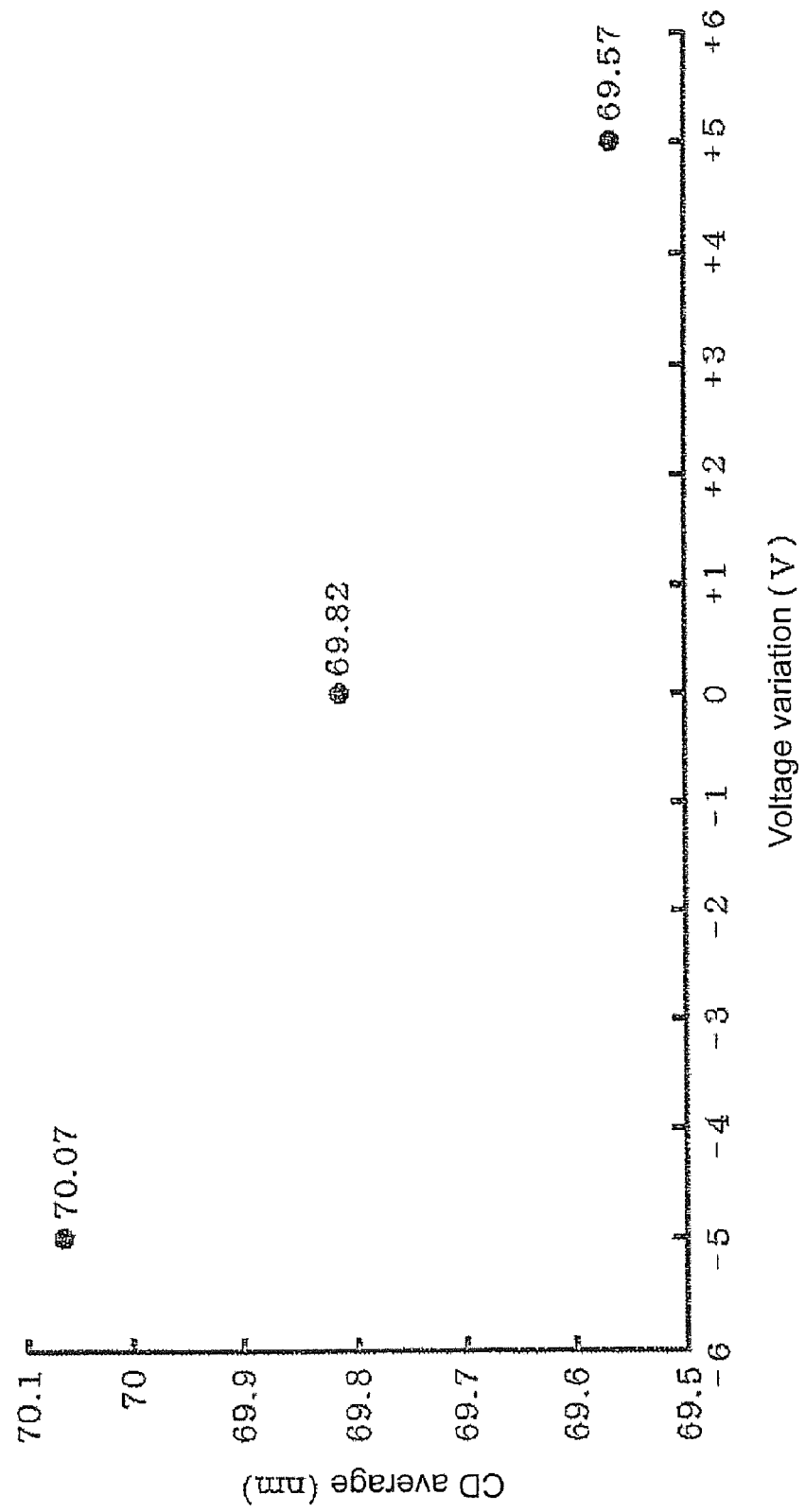
FIG. 9 is a graph showing CDs of resist patterns formed on wafers in an evaluation test.

FIG. 9 shows a variation of CDs, caused by the difference of the input voltage. A reference voltage is set to be 200V, and the voltage fluctuation at this time is assumed as 0. Accordingly, the voltage fluctuation of 205V is +5V, and the voltage fluctuation of 195V is −5V. In the graph shown in FIG. 9, the x axis represents a voltage fluctuation, and the y axis represents a CD of wafers. The treatments at 200V, 195V, and 205V resulted in different CDs, in which the CDs were 69.82 nm, 70.07 nm, 69.57 nm, respectively. From the EVALUATION TEST 2, it can be found out that when the input voltage to a heat plate varies, the thermal history and CD of a wafer vary.

Evaluation Test 3

Input voltages of three (3) heat treatment modules were set as 170V, 200V, and 242V, respectively, and the thermal history of a wafer was measured in the same manner as EVALUATION TEST 2. In EVALUATION TEST 3, the correction value was calculated by a voltage correction calculation unit, and the conduction rate in each heat plate was controlled in the same manner as the embodiment. Heat treatments in each heat treatment module were repeatedly performed plural times.

Figure 10:
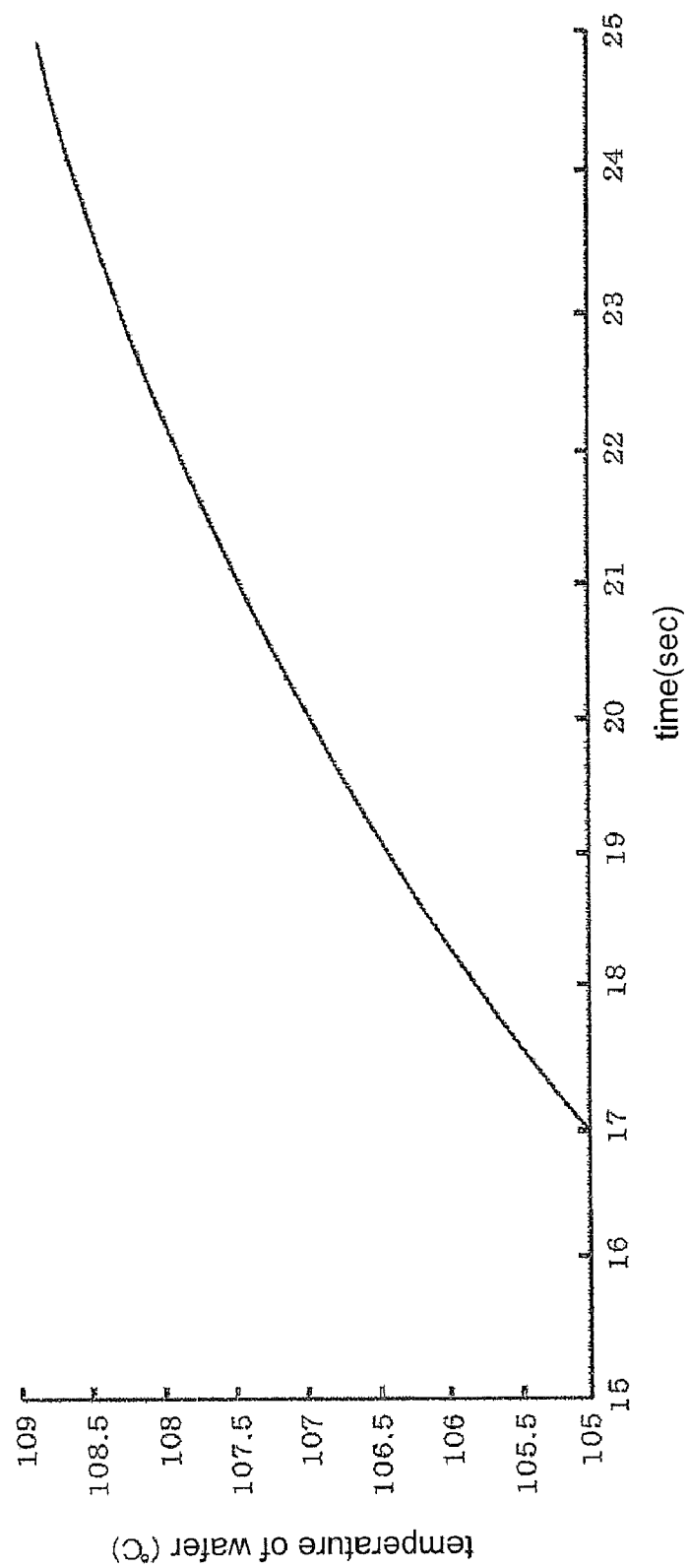
FIG. 10 is a graph showing a thermal history of a wafer treated in an evaluation test.

FIG. 10 is a graph showing the result of EVALUATION TEST 3. From the graph, it can be found out that the wafer temperatures are risen in approximately the same manner with any one of input voltages of 170V, 200V and 242V. Also, wafers showed similar thermal histories after a plurality of repeated treatments. From these results, it can be found out that the thermal histories of wafers may be reconciled in accordance with the present disclosure. Also, based on the results from EVALUATION TEST 2, it can be determined that the variation of CDs is caused by the fluctuation of thermal histories of wafers. Accordingly, the resist patterns may be formed with high uniformity in respective wafers by reconciling the thermal histories among the wafers in this manner.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus to perform a heat treatment on a substrate for manufacturing a semiconductor disposed on a heat plate by a heater provided in the heat plate, comprising:
    three heat plates each configured to dispose the substrate and provided with the heater
    a temperature detecting part provided in each of the three heat plates configured to detect a temperature of the substrate disposed on each of the three heat plates;
    an adjusting unit configured to output a power control signal to each of the three heat plates based on a difference between a temperature setting value of the substrate and a temperature detection value of the temperature detecting part in each of the three heat plates;

an AC power supply part configured to supply power to the heater provided in each of the three heat plates;

a distribution part provided in the AC power supply part and configured to distribute each phase of three-phase AC of the AC power supply part to the heater of each of the three heat plates;

a control unit configured to control a conduction rate of an AC voltage distributed from the distribution part of the AC power supply part and output to the heater of each of the three heat plates based on the power control signal in each of the three heat plates;

a voltage detecting part configured to sequentially detect the AC voltage of each phase of three-phase AC; and a correction part configured to correct the power control signal output from the adjusting unit so that the conduction rate is decreased when a voltage detection value is increased or resistance of the heater is decreased, wherein the correction part corrects the power control signal output using a value obtained by multiplying a first correction value with a second correction value, the first correction value being generated according to a ratio of the voltage detection value of one of the phases of the three-phase AC detected by the voltage detecting part to a predetermined reference voltage, and the second correction value being generated according to a ratio of the resistance value of the heater of each of the three heat plates to which the AC voltage of a detected phase is distributed to a predetermined reference resistance value, and wherein the correction part corrects the power control signal output to each of the three heat plates, the reference voltage is the smallest value among a voltage variation of the AC voltage, the reference resistance is the largest value among a resistance variation of the heater, and the conduction rate becomes a maximum when the voltage detection value is the reference voltage and the resistance value is the reference resistance value.

2. The heat treatment apparatus as claimed in claim 1, wherein the value obtained by multiplying the first correction value with the second correction value is output to the correction part from an upper level controller common to the three heat plates.

3. A heat treatment method performing a heat treatment on a substrate for manufacturing a semiconductor disposed on a heat plate by a heater provided in the heat plate, comprising:

providing three heat plates each configured to dispose the substrate and provided with the heater;

detecting a temperature of the substrate disposed on each of the three heat plates by a temperature detecting part provided in each of the three heat plates;

outputting a power control signal to each of the three heat plates by an adjusting unit based on a difference between a temperature setting value of the substrate and a temperature detection value detected by the temperature detecting part;

distributing and supplying each phase of three-phase AC of an AC power supply part to the heater of each of the three heat plates by a distribution part provided in the AC power supply part common to each of the three heat plates;

controlling a conduction rate of an AC voltage distributed from the distribution part of the AC power supply part and output to the heater in each of the three heat plates by a control unit based on the power control signal; sequentially detecting the AC voltage of each phase of three-phase AC which is a first side of the distribution part by a voltage detecting part; and correcting the power control signal output from the adjusting unit by a correction part so as to the conduction rate is decreased when a voltage detection value is increased or resistance of the heater is decreased, wherein the correction part corrects the power control signal output using a value obtained by multiplying a first correction value with a second correction value, the first correction value being generated according to a ratio of the voltage detection value of one of the phases of the three-phase AC detected by the voltage detecting part to a predetermined reference voltage, and the second correction value being generated according to a ratio of the resistance value of the heater of each of the three heat plates to which the AC voltage of a detected phase is distributed to a predetermined reference resistance value, and wherein the correcting process of the power control signal is performed with respect to the power control signal output to each of the three heat plates, the reference voltage is the smallest value among a voltage variation of the AC voltage, the reference resistance is the largest value among a resistance variation of the heater, and the conduction rate becomes a maximum when the voltage detection value is the reference voltage and the resistance value is the reference resistance value.

4. The heat treatment method as claimed in claim 3, further comprising outputting the multiplied value to the correction part from an upper level controller common to the three heat plates.

5. A non-transitory computer readable storage medium to store a program used in an apparatus to perform a heat treatment on a substrate disposed on a heat plate by a heater provided in the heat plate, wherein in the program, a group of steps to execute the heat treatment method as claimed in claim 3 is programmed.

* * * * *